United States Patent
Sakata et al.

(10) Patent No.: US 11,600,352 B2
(45) Date of Patent: Mar. 7, 2023

(54) STORAGE DEVICE

(71) Applicant: KIOXIA CORPORATION, Tokyo (JP)

(72) Inventors: Akihiro Sakata, Kamakura Kanagawa (JP); Tomonori Yokoyama, Kawasaki Kanagawa (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/459,807

(22) Filed: Aug. 27, 2021

(65) Prior Publication Data
US 2022/0310188 A1  Sep. 29, 2022

(30) Foreign Application Priority Data

Mar. 24, 2021 (JP) .............................. JP2021-050682

(51) Int. Cl.
| | |
|---|---|
| *G11C 29/42* | (2006.01) |
| *G11C 29/00* | (2006.01) |
| *G11C 29/18* | (2006.01) |
| *G11C 7/10* | (2006.01) |
| *G06F 12/02* | (2006.01) |

(52) U.S. Cl.
CPC .......... *G11C 29/42* (2013.01); *G06F 12/0238* (2013.01); *G11C 7/1069* (2013.01); *G11C 7/1096* (2013.01); *G11C 29/18* (2013.01); *G11C 29/785* (2013.01); *G06F 2212/7201* (2013.01); *G11C 2029/1802* (2013.01)

(58) Field of Classification Search
CPC ..... G11C 29/42; G11C 7/1069; G11C 7/1096; G11C 29/18; G11C 29/785; G11C 2029/1802
See application file for complete search history.

(56) References Cited

U.S. PATENT DOCUMENTS

| | | | |
|---|---|---|---|
| 9,454,437 B2 | 9/2016 | Waechter et al. | |
| 9,646,719 B2* | 5/2017 | Kim ................. | G11C 29/56012 |
| 9,678,682 B2 | 6/2017 | Lobo et al. | |
| 10,580,512 B2* | 3/2020 | Subramanian ......... | G11C 29/38 |
| 11,200,961 B1* | 12/2021 | Uribe ..................... | G11C 29/44 |
| 11,366,740 B2* | 6/2022 | Grimwood .......... | G06F 11/3624 |
| 2019/0332468 A1 | 10/2019 | Chaiken et al. | |

* cited by examiner

*Primary Examiner* — Vanthu T Nguyen
(74) *Attorney, Agent, or Firm* — Kim & Stewart LLP (57) ABSTRACT

A storage device includes a memory, a write circuit, a read circuit, and a debug information register. The memory includes a data area and a redundant area that corresponds to the data area. The write circuit writes first data specified in a write command to the data area, and first information about a transmission source which has transmitted the write command, to the redundant area. The read circuit reads the first data as second data from the data area, and reads the first information as second information from the redundant area, in response to a read command. The debug information register stores the second information read by the read circuit.

20 Claims, 8 Drawing Sheets

STORAGE DEVICE

CROSS-REFERENCE TO RELATED APPLICATION(S)

This application is based upon and claims the benefit of priority from Japanese Patent Application No. 2021-050682, filed Mar. 24, 2021, the entire contents of which are incorporated herein by reference.

FIELD

Embodiments described herein relate generally to a storage device.

BACKGROUND

A storage device used for developing software such as firmware or programs is known.

DETAILED DESCRIPTION

Embodiments provide a storage device capable of acquiring debug information when software is developed.

In general, according to one embodiment, a storage device includes a memory, a write circuit, a read circuit, and a first storage circuit. The memory includes a data area and a redundant area that corresponds to the data area. The write circuit writes first data specified in a write command to the data area, and stores first information about a transmission source which has transmitted the write command, to the redundant area. The read circuit reads the first data as second data from the data area, and reads the first information as second information from the redundant area, in response to a read command. The first storage circuit stores the second information read by the read circuit.

Hereinafter, embodiments of the present invention will be described with reference to the accompanying drawings. In the descriptions below, components having a similar function or configuration will be denoted by the same reference numerals. Further, the embodiments described herein below are examples of the technical idea of the present invention.

A functional block may be implemented as either hardware or computer software, or a combination of hardware and computer software. Further, a portion of functions of a functional block may be executed by a separate functional block. Further, a functional block may be divided into functional sub-blocks.

1. First Embodiment

Hereinafter, a storage device of a first embodiment will be described. The storage device of the first embodiment is capable of storing data, and for example, may be used when software, such as firmware or programs, is developed. When the software, such as firmware or programs, is developed, debugging is performed to detect and correct errors (e.g., bugs).

In the first embodiment, when data is written, debug information is added to the write data, rather than adding an error correction code (ECC). Debug information is stored in a redundant area. Further, when a read operation is performed, debug information is read together with the write data. The read debug information is stored in a register. The write data is data that is written to the storage device during the write operation. Debug information is information used for debugging.

1-1 Configuration of First Embodiment

Figure 1:
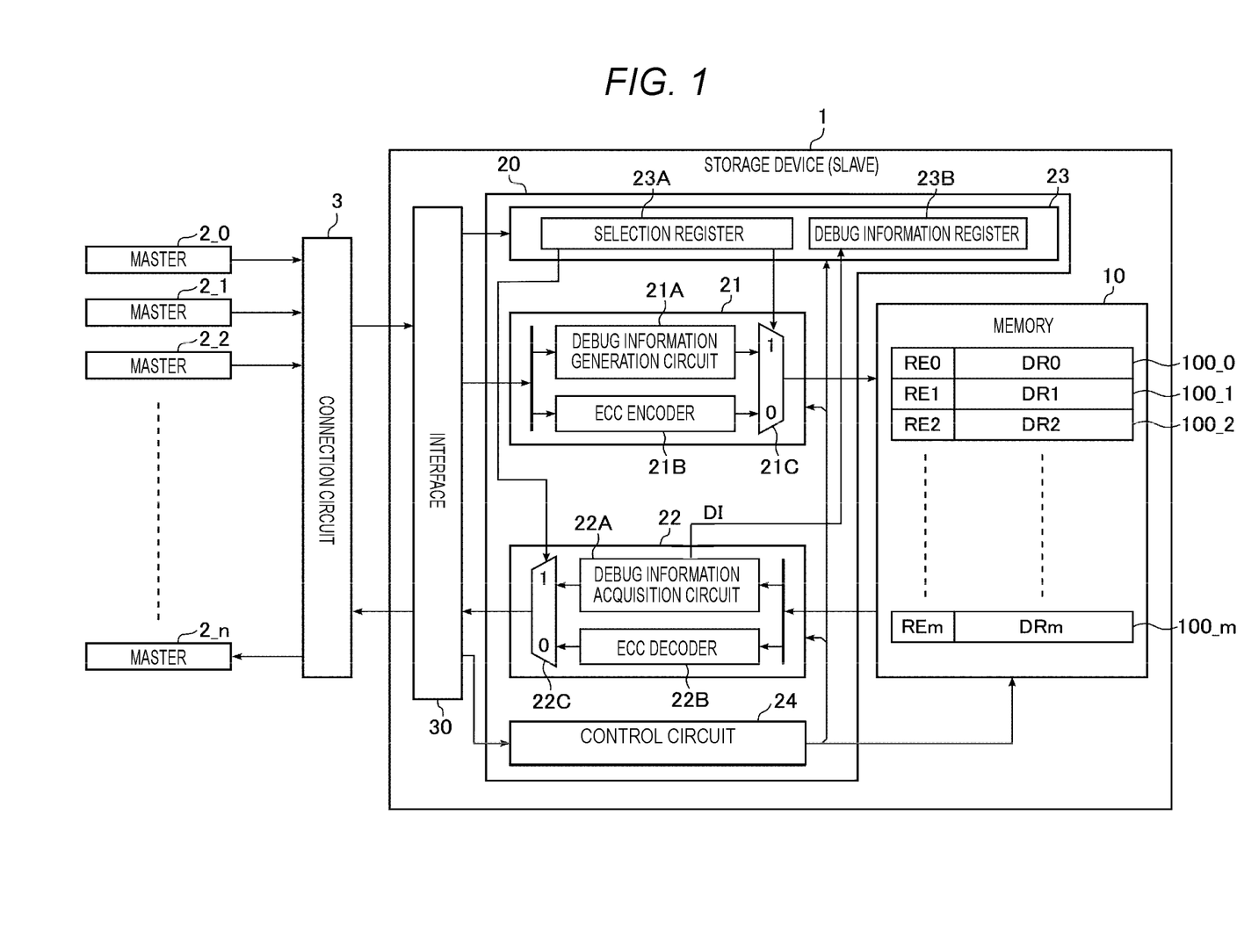
FIG. 1 is a block diagram illustrating a configuration of a storage device according to a first embodiment.

FIG. 1 is a block diagram illustrating a configuration of the storage device of the first embodiment. FIG. 1 also illustrates a configuration of an information processing system that includes the storage device. The information processing system includes a storage device (also referred to as a slave) 1, a plurality of masters $2\_0, 2\_1, 2\_2, \ldots, 2\_n$ (n is a natural number of 1 or more), and a connection circuit 3. The information processing system illustrated in FIG. 1 is, for example, a part of a memory controller which may be configured with a circuit such as a system-on-a-chip (SoC) and may be included in an electronic device such as a solid state drive (SSD).

The storage device 1 stores data received from at least one of the plurality of masters $2\_0, 2\_1, 2\_2, \ldots, 2\_n$. Further, the storage device 1 transmits the stored data to at least one of the plurality of masters $2\_0, 2\_1, 2\_2, \ldots, 2\_n$. The plurality of masters $2\_0, 2\_1, 2\_2, \ldots, 2\_n$ are connected to the storage device 1 via the connection circuit 3.

The plurality of masters $2\_0, 2\_1, 2\_2, \ldots, 2\_n$ are each, for example, a central processing unit (CPU) or a hardware engine. The plurality of masters $2\_0, 2\_1, 2\_2, \ldots, 2\_n$ output write commands or read commands to the storage device 1. Hereinafter, the plurality of masters $2\_0, 2\_1, 2\_2, \ldots, 2\_n$ will be referred to as a plurality of masters 2.

The connection circuit 3 connects one or more masters among the plurality of masters 2 to the storage device 1.

Next, the internal configuration of the storage device 1 will be described. The storage device 1 includes a memory 10, a controller 20, and an interface 30.

The memory 10 is, for example, a static random access memory (SRAM). The memory 10 stores data received by the storage device 1.

The controller 20 controls the operation of the memory 10. Details of the controller 20 will be described later.

The interface 30 is a hardware interface that connects the storage device 1 and an external information processing device to each other for communication. The interface 30 transmits and receives signals and data between the plurality of masters 2 and the storage device 1. The interface 30 conforms to, for example, an Advanced eXtensible Interface (AXI) protocol.

Next, the internal configuration of the memory 10 will be described. The memory 10 includes a plurality of storage areas $100\_0, 100\_1, 100\_2, \ldots, 100\_m$ (m is a natural number of 1 or more) capable of storing data. One storage area 100_*k* (k is any integer among 0, 1, . . . , m) includes a data area DRk and a redundant area REk additionally provided therein.

That is, the storage area 100_0 includes a data area DR0 and a redundant area RE0 additionally provided therein. The storage area 100_1 includes a data area DR1 and a redundant area RE1 additionally provided therein. Hereinafter, a plurality of storage areas will be referred to as a plurality of storage areas 100. A plurality of data areas will be referred to as a plurality of data areas DR. A plurality of redundant areas will be referred to as a plurality of redundant areas RE.

The data area DRk stores data. The redundant area REk stores specific information that corresponds to the data stored in the corresponding data area DRk, for example, an error correction code or debug information DI. The error correction code is a code used for correcting an error in the data. The error correction code is, for example, a parity bit. The debug information DI is information used when debugging is performed. The debug information DI is, for example, information about a transmission source that transmits a data write command (e.g., the master 2_*n*), or an address of a data write location or a data read location.

Next, the internal configuration of the controller 20 will be described. The controller 20 includes a write circuit 21, a read circuit 22, a register group 23, and a control circuit 24.

The write circuit 21 is a circuit that stores data in the memory 10. The write circuit 21 operates in either a debug operation mode or a normal operation mode. In the debug operation mode, the write circuit 21 adds debug information DI to write data that is input from the master 2, based on a write command from the master 2. Further, the write circuit 21 stores the write data and the debug information DI in, for example, the plurality of storage areas 100. In the normal operation mode, the write circuit 21 adds an error correction code to write data that is input from the master 2, based on a write command from the master 2. Further, the write circuit 21 stores the write data and the error correction code in, for example, the plurality of storage areas 100.

The read circuit 22 is a circuit that reads data from the memory 10. The read circuit 22 operates in either the debug operation mode or the normal operation mode. In the debug operation mode, the read circuit 22 reads data and debug information DI from, for example, the plurality of storage areas 100, based on a read command from the master 2. Further, the read circuit 22 outputs the read data to the master 2, and outputs the debug information DI to a debug information register 23B. In the normal operation mode, the read circuit 22 reads data and an error correction code from, for example, the plurality of storage areas 100, based on a read command from the master 2. Further, the read circuit 22 generates a syndrome based on the read data and the error correction code, and performs an error detection based on the generated syndrome. When no error is detected in the syndrome, the read circuit 22 outputs the read data to the master 2. When an error is detected in the syndrome, the read circuit 22 performs an error correction on the read data, and outputs the corrected data to the master 2.

The register group 23 is a circuit that stores multiple information on the operation mode and the debug information DI. The details of the register group 23 will be described later.

The control circuit 24 is, for example, a state machine, a sequencer, or a central processing unit (CPU). The control circuit 24 controls the operations of the write circuit 21, the read circuit 22, the register group 23, and the memory 10. For example, during the write operation or the read operation, the control circuit 24 performs an address conversion between a logical address input from the master 2 and a physical address that designates a storage location in the plurality of storage areas 100 or a storage location in the register group 23. For example, the address conversion between the logical address and the physical address is performed by using a conversion formula. In this case, shifting the logical address by several bits may result in the physical address, and/or a part (e.g., several bits) of the logical address may be treated as the physical address. Alternatively, the control circuit 24 may read an address conversion table from the memory 10, and refer to the read address conversion table for the address conversion.

Next, the internal configuration of the write circuit 21 will be described. The write circuit 21 includes a debug information generation circuit 21A, an ECC encoder 21B, and a selection circuit 21C.

The debug information generation circuit 21A operates when the write circuit 21 operates in the debug operation mode. The debug information generation circuit 21A generates debug information DI.

The ECC encoder 21B operates when the write circuit 21 operates in the normal operation mode. The ECC encoder 21B generates an error correction code based on write data that is input from the master 2.

The selection circuit 21C selects the output of the debug information generation circuit 21A when the write circuit 21 operates in the debug operation mode. The selection circuit 21C selects the output of the ECC encoder 21B when the write circuit 21 operates in the normal operation mode. Specifically, the selection circuit 21C selects the output of either the debug information generation circuit 21A or the ECC encoder 21B based on selection information stored in a selection register 23A to be described later.

Next, the internal configuration of the read circuit 22 will be described. The read circuit 22 includes a debug information acquisition circuit 22A, an ECC decoder 22B, and a selection circuit 22C.

The debug information acquisition circuit 22A operates when the read circuit 22 operates in the debug operation mode. The debug information acquisition circuit 22A acquires debug information DI from data read from the plurality of storage areas 100 (hereinafter, read data) and debug information DI read from the same. The debug information acquisition circuit 22A outputs the debug information DI to the debug information register 23B to be described later.

The ECC decoder 22B operates when the read circuit 22 operates in the normal operation mode. For example, the ECC decoder 22B generates a syndrome based on read data and an error correction code that are read from the plurality of storage areas 100, and detects and corrects an error in the read data based on the generated syndrome.

The selection circuit 22C selects the output of the debug information acquisition circuit 22A when the read circuit 22 operates in the debug operation mode. The selection circuit 22C selects the output of the ECC decoder 22B when the read circuit 22 operates in the normal operation mode. Specifically, the selection circuit 22C selects the output of either the debug information acquisition circuit 22A or the ECC decoder 22B based on the selection information stored in the selection register 23A to be described later.

Next, the internal configuration of the register group 23 will be described. The register group 23 includes the selection register (more generally referred to as a storage circuit) 23A and the debug information register (more generally referred to as a storage circuit) 23B. The selection register 23A stores the selection information for selecting either the debug operation mode or the normal operation mode. The debug information register 23B stores the debug information DI acquired by the debug information acquisition circuit 22A.

1.2 Operation of First Embodiment

Hereinafter, the operation of the storage device 1 of the first embodiment will be described. The storage device 1 operates in the normal operation mode or the debug operation mode.

In the normal operation mode, the storage device 1 may execute a normal write operation or a normal read operation. In the normal operation mode, the ECC encoder 21B of the write circuit 21 in the storage device 1 is selected. Further, in the normal operation mode, the ECC decoder 22B of the read circuit 22 in the storage device 1 is selected.

The normal write operation is an operation performed when a write command and write data are received from the master 2. The ECC encoder 21B of the write circuit 21 in the storage device 1 adds an error correction code to the received write data. The write circuit 21 stores the write data in, for example, a data area DR of the memory 10. Further, the write circuit 21 stores the error correction code in a redundant area RE of the memory 10.

The normal read operation is an operation performed when a read command and a logical address are received from the master 2. The read circuit 22 of the storage device 1 reads data and an error correction code from the storage area 100 that corresponds to the logical address. The ECC decoder 22B in the read circuit 22 generates a syndrome based on the data and the error correction code that have been read, and performs an error detection based on the generated syndrome. When no error is detected in the syndrome, the read circuit 22 outputs the read data to the master 2. When an error is detected in the syndrome, the read circuit 22 performs an error correction on the read data, and outputs the corrected data to the master 2.

In the debug operation mode, the storage device 1 may execute a write operation or a read operation in response to an operation test performed on a program generated during code editing. In the debug operation mode, the storage device 1 may execute a debug write operation or a debug read operation. In the debug operation mode, the debug information generation circuit 21A of the write circuit 21 in the storage device 1 is selected. Further, in the debug operation mode, the debug information acquisition circuit 22A of the read circuit 22 in the storage device 1 is selected.

The debug write operation is an operation performed when a write command and write data are received from the master 2. The debug information generation circuit 21A of the write circuit 21 in the storage device 1 adds debug information DI to the received write data. The write circuit 21 stores the write data in, for example, a data area DR of the memory 10. Further, the write circuit 21 stores the debug information DI in a redundant area RE of the memory 10.

The debug read operation is an operation performed when a read command and a logical address are received from the master 2. The read circuit 22 of the storage device 1 reads data and debug information DI from the storage area 100 that corresponds to the logical address. The debug information acquisition circuit 22A in the read circuit 22 acquires only the debug information DI from the data and the debug information DI that have been read. The debug information acquisition circuit 22A transmits the acquired debug information DI to the debug information register 23B. The debug information register 23B stores the received debug information DI.

Figure 2:
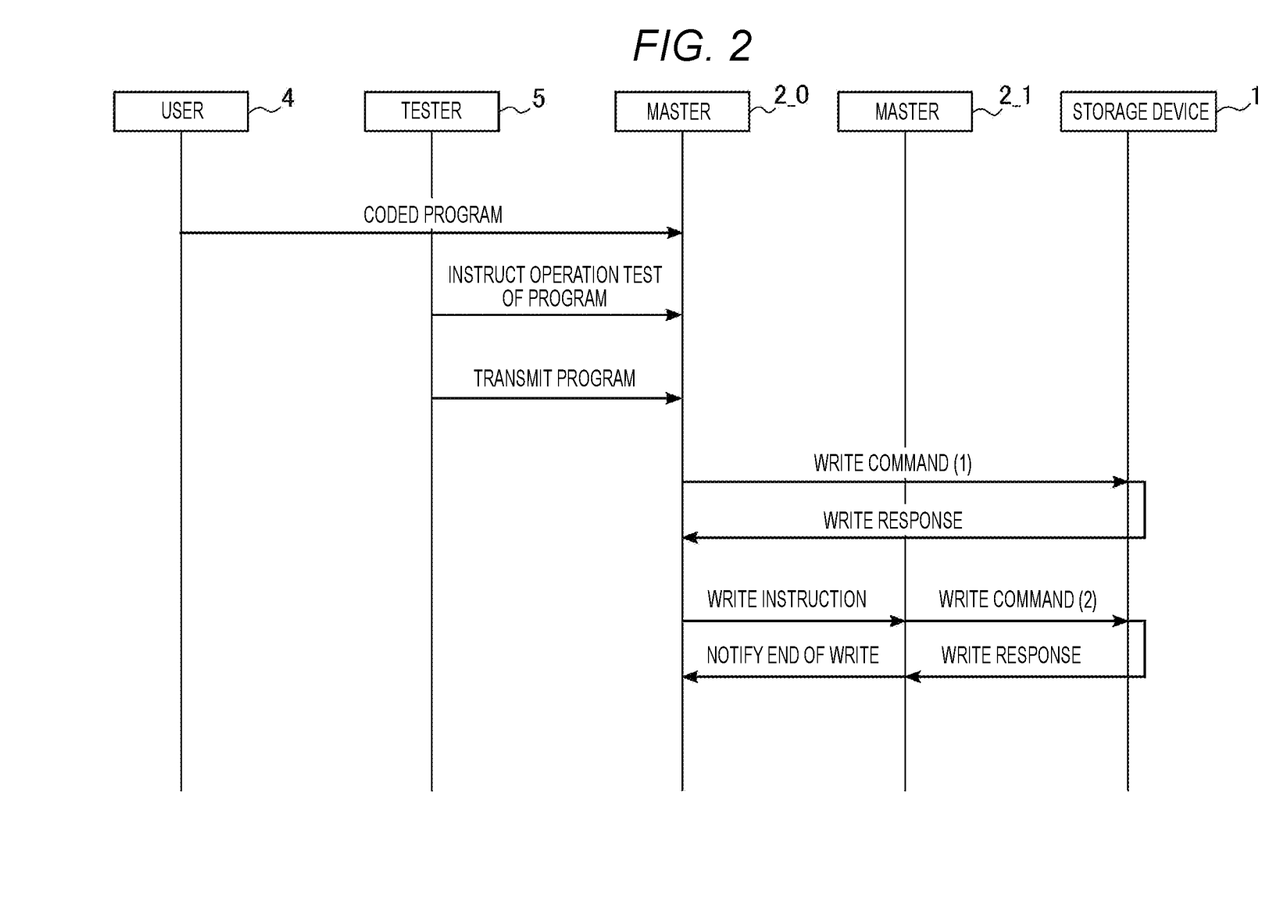
FIG. 2 illustrates an example of a program-based operation according to the first embodiment.

Hereinafter, the operation of the storage device 1 in the debug operation mode will be described in detail with reference to FIGS. 2, 3, and 4. FIG. 2 illustrates an example of an operation carried out by executing a program (hereinafter, referred to as a program-based operation) in the information processing system that includes the storage device 1 according to the first embodiment. FIG. 2 represents an exchange of commands, operations, and an exchange of data among a user 4, a tester 5, the masters 2_0 and 2_1, and the storage device 1. The tester 5 is, for example, a circuit on an evaluation board for evaluating a memory controller when the master 2 and the storage device 1 are configured as a part of the memory controller. In this case, the tester 5 and the memory controller are mounted on the evaluation board.

The user 4 performs code editing to generate the program that is to be executed by the master 2_0. Next, the user 4 performs an operation test of the program using the tester 5. Through the operation test of the program, it may be confirmed whether the program operates as desired.

The operation test of the program generated by the user 4 may be performed, for example, under the following two scenarios. One is a case where a single user 4 generates a program to be executed by the master 2_0. In this case, the single user 4 performs the operation test on the generated program. Note that, in this case, for example, the master 2_0 is a CPU, and the master 2_1 is a hardware engine (e.g., a direct memory access controller (DMAC)). The other is a case where a plurality of users 4 generates a program to be executed by the masters 2_0 and 2_1. In this case, the plurality of users 4 perform the operation test on the generated program.

Hereinafter, a specific example of the operation test of the generated program will be described. For the sake of descriptions, the program in the specific example is intentionally generated to include a bug such that an error occurs.

The tester 5 instructs the master 2_0 to perform the operation test of the program based on an instruction from the user 4. The tester 5 transmits the program to the master 2_0.

By executing the received program, the master 2_0 transmits a write command (1) to the storage device 1. The write command (1) includes first data as write data, a first logical address, and information indicating that the master 2_0 is a transmission source (hereinafter, master information MI1).

When the write command (1) is received, the storage device 1 converts the first logical address into a first physical address. Further, the debug information generation circuit 21A of the storage device 1 generates debug information DI1 based on the master information MI1. The debug information DI1 is, for example, information that includes the master information MI1.

The storage device 1 stores the first data in the data area of the storage area designated by the first physical address. Further, the storage device 1 stores the debug information DI1 in the redundant area of the storage area designated by the first physical address.

After the first data and the debug information DI1 are stored, the storage device 1 transmits a write response that notifies the end of the write operation, to the master 2_0.

After the write response is received, the master 2_0 transmits a write instruction to the master 2_1 by executing the program.

When the write instruction is received, the master 2_1 transmits a write command (2) to the storage device 1. The write command (2) includes second data as write data, a second logical address, and information indicating that the master 2_1 is a transmission source (hereinafter, master information MI2). Here, it is assumed that the second logical address partially overlaps the first logical address due to the bug in the program.

When the write command (2) is received, the storage device 1 converts the second logical address into a second physical address. Further, the debug information generation circuit 21A of the storage device 1 generates debug information DI2 based on the master information MI2. The debug information DI2 is, for example, information that includes the master information MI2.

The storage device 1 stores the second data in the data area of the storage area designated by the second physical address. Further, the storage device 1 stores the debug information DI2 in the redundant area of the storage area designated by the second physical address. At least a portion of the first data written by the write operation according to the write command (1) is overwritten by the write operation according to the write command (2). Hereinafter, the process by which at least the portion of the first data stored in the memory 10 is rewritten with the second data different from the first data will be referred to as data destruction. Further, the first data that is at least partially rewritten will be referred to as destroyed data.

After the second data and the debug information DI2 are stored, the storage device 1 transmits a write response that notifies the end of the write operation, to the master 2_1.

When the write response is received, the master 2_1 transmits a signal that notifies the end of the write operation, to the master 2_0.

Descriptions have been made on the program-based operation in a specific example. The operation of the master 2_0 may differ according to a program executed by the master 2_0.

After the program-based operation in the specific example is ended, the master 2_0 performs an inspection of the data stored in the storage device 1. FIG. 3 illustrates an example of an inspection operation according to the first embodiment.

After the signal that notifies the end of the write operation of the write command (2) is received, the master 2_0 transmits a read command (3) to the storage device 1. The read command (3) includes the logical addresses included in the write commands of the previous program-based operation. That is, the read command (3) includes the first logical address included in the write command (1) and the second logical address included in the write command (2).

When the read command (3) is received, the storage device 1 converts the first logical address into the first physical address. Further, the storage device 1 converts the second logical address into the second physical address. The storage device 1 reads the first data and the second data from the respective data areas of the storage areas designated by the first physical address and the second physical address. Further, the storage device 1 reads the debug information DI1 and the debug information DI2 from the respective redundant areas of the storage areas designated by the first physical address and the second physical address.

The storage device 1 transmits the read first data, second data, debug information DI1, and debug information DI2 to the master 2_0.

Note that the storage device 1 may transmit, to the master 2_0, the debug information DI1 as auxiliary data of the first data, and the debug information DI2 as auxiliary data of the second data, as a response to the read command (3). The auxiliary data is transmitted, for example, in an RUSER field of the AXI protocol.

Figure 3:
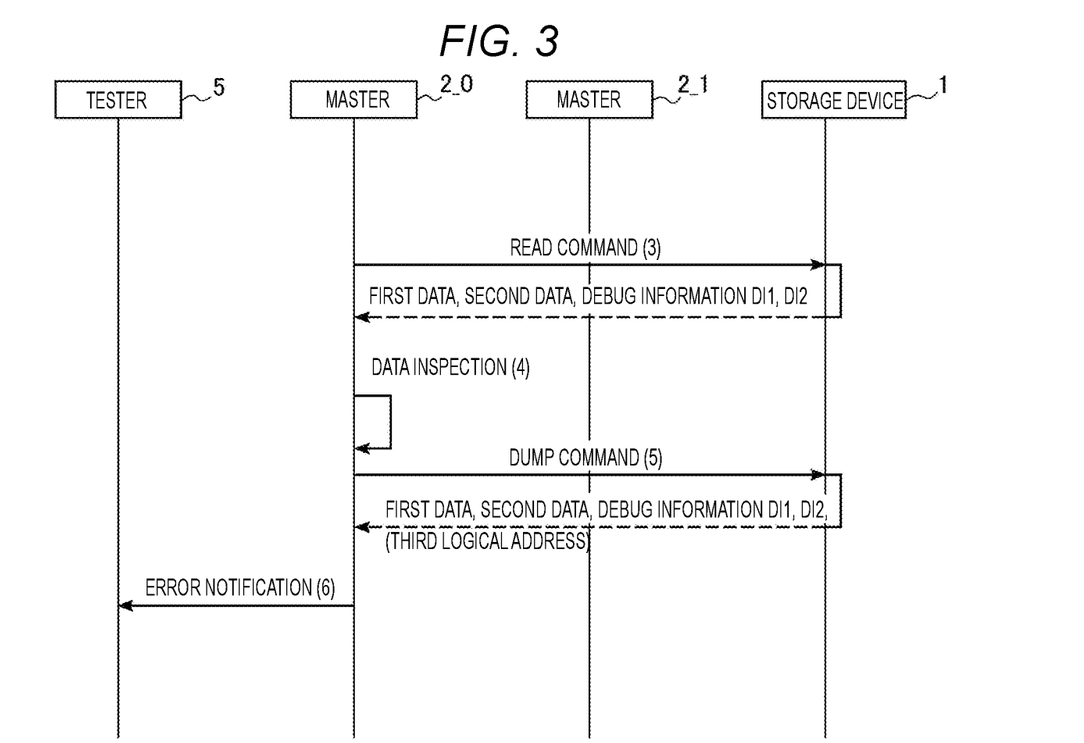
FIG. 3 illustrates an example of an inspection operation according to the first embodiment.

When the first data, the second data, the debug information DI1, and the debug information DI2 are received, the master 2_0 inspects the received first data, second data, debug information DI1, and debug information DI2 (depicted as data inspection (4) in FIG. 3). As a result of the inspection, the master 2_0 detects that an error of data destruction occurs in the first data. For example, when the debug information DI1 and the debug information DI2 include different master information (e.g., master information MI1 and master information MI2), the master 2_0 may detect that at least a part of the first data has been destroyed by a master (i.e., master 2_1) different from the master 2_0.

The master 2_0 that has detected the occurrence of the error transmits a dump command (5) to the storage device 1. The dump command (5) includes a logical address range including at least the first logical address, which is associated with the first data in which the occurrence of the error is detected during the data inspection (4), and the second logical address. When the dump command (5) is received, the storage device 1 converts the first logical address into the first physical address. The storage device 1 reads the first data from the data area of the storage area designated by the first physical address. The storage device 1 also reads the debug information DI1 from the redundant area of the storage area designated by the first physical address. Similarly, the storage device 1 converts the second logical address into the second physical address. The storage device 1 reads the second data from the data area of the storage area designated by the second physical address. The storage device 1 also reads the debug information DI2 from the redundant area of the storage area designated by the second physical address.

As a response to the dump command (5), the storage device 1 transmits, to the master 2_0, data corresponding to the logical address range included in the dump command (5), which includes at least the first data, the second data, the debug information DI1, and the debug information DI2.

Alternatively, the debug information acquisition circuit 22A of the storage device 1 acquires the read debug information DI1 and debug information DI2. Further, the debug information acquisition circuit 22A transmits the acquired debug information DI1 and debug information DI2 to the debug information register 23B. The debug information register 23B stores the debug information DI1 and the debug information DI2. Note that the debug information DI1 and the debug information DI2 may be stored in a region of the memory 10.

The storage device 1 converts a third physical address which is an address that designates the debug information register 23B (or the region of the memory 10), into a third logical address. The storage device 1 transmits at least the first data, the second data, and the third logical address to the master 2_0 as a response to the read command (3) or the dump command (5).

When any of the first data, the second data, the debug information DI1, the debug information DI2, and the third logical address are received, the master 2_0 notifies the tester 5 of the received first data, second data, debug information DI1, debug information DI2, and third logical address (depicted as error notification (6) in FIG. 3). Then, the operation test of the program by the tester 5 is ended.

When the error of data destruction is not detected in the first data during the data inspection (4), the master 2_0 notifies the tester 5 that no error is detected. After the notification, the operation test of the program by the tester 5 is ended.

Next, the read operation of debug information will be described. FIG. 4 illustrates the read operation of debug information according to the first embodiment. This operation is performed when the storage device transmits the third logical address to the master 2_0. By the read operation of debug information, the user 4 may identify the transmission source of the write command (2) that causes the data destruction in the first data.

The tester 5 instructs the master 2_0 to read the debug information based on an instruction from the user 4.

When the instruction to read debug information is received, the master 2_0 transmits a read command (7) to the storage device 1. The read command (7) includes the third logical address. The third logical address is an address that designates the debug information register 23B (or the region of the memory 10) in which the debug information DI1 and the debug information DI2 are stored.

When the read command (7) is received, the storage device 1 converts the third logical address into the third physical address. The storage device 1 reads the debug information DI1 and the debug information DI2 from the debug information register 23B (or the region of the memory 10) designated by the third physical address. The storage device 1 transmits the read debug information DI1 and debug information DI2 to the master 2_0.

Figure 4:
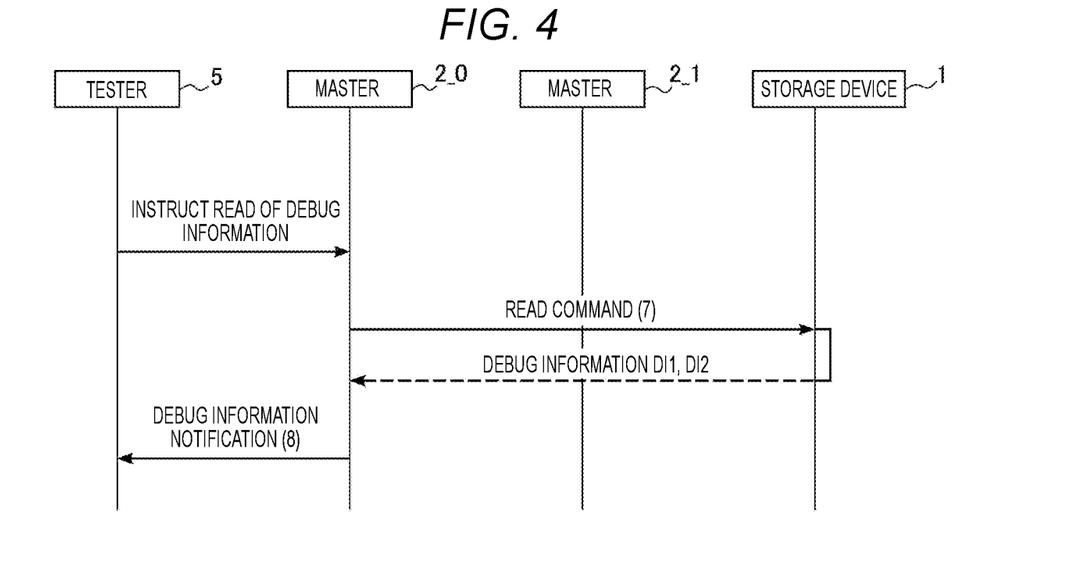
FIG. 4 illustrates a read operation of debug information according to the first embodiment.

When the debug information DI1 and the debug information DI2 are received, the master 2_0 notifies the tester 5 of the received debug information DI1 and debug information DI2 (depicted as debug information notification (8) in FIG. 4). Then, the read operation of debug information is ended.

1.3 Effects of First Embodiment

According to the first embodiment, it is possible to provide a storage device capable of acquiring debug information when software is developed. That is, according to the storage device 1 of the first embodiment, debug information can be acquired when software is developed.

According to the storage device 1 of the first embodiment, when data destruction occurs, the transmission source of the write command that causes the data destruction can be identified, by reading the debug information DI. Further, the storage device 1 stores the debug information DI in the debug information register 23B or the region of the memory 10. As a result, the master 2_n reads the debug information DI from the debug information register 23B or the region of the memory 10, so that the debug information DI can be easily acquired.

Further, according to the storage device 1 of the first embodiment, since a memory management unit (MMU) does not need to be provided to prevent the data destruction, an increase in product costs can be suppressed.

2. Second Embodiment

Hereinafter, a storage device of a second embodiment will be described. In the second embodiment, when a write operation of data is performed, debug information, rather than an error correction code is added to write data. The debug information is stored in a redundant area. Further, when a read operation is performed, the address of the redundant area in the storage area to be read is stored in a first register. When data destruction occurs, the debug information is read from the redundant area designated by the address stored in the first register. The read debug information is stored in a second register.

2-1 Configuration of Second Embodiment

Figure 5:
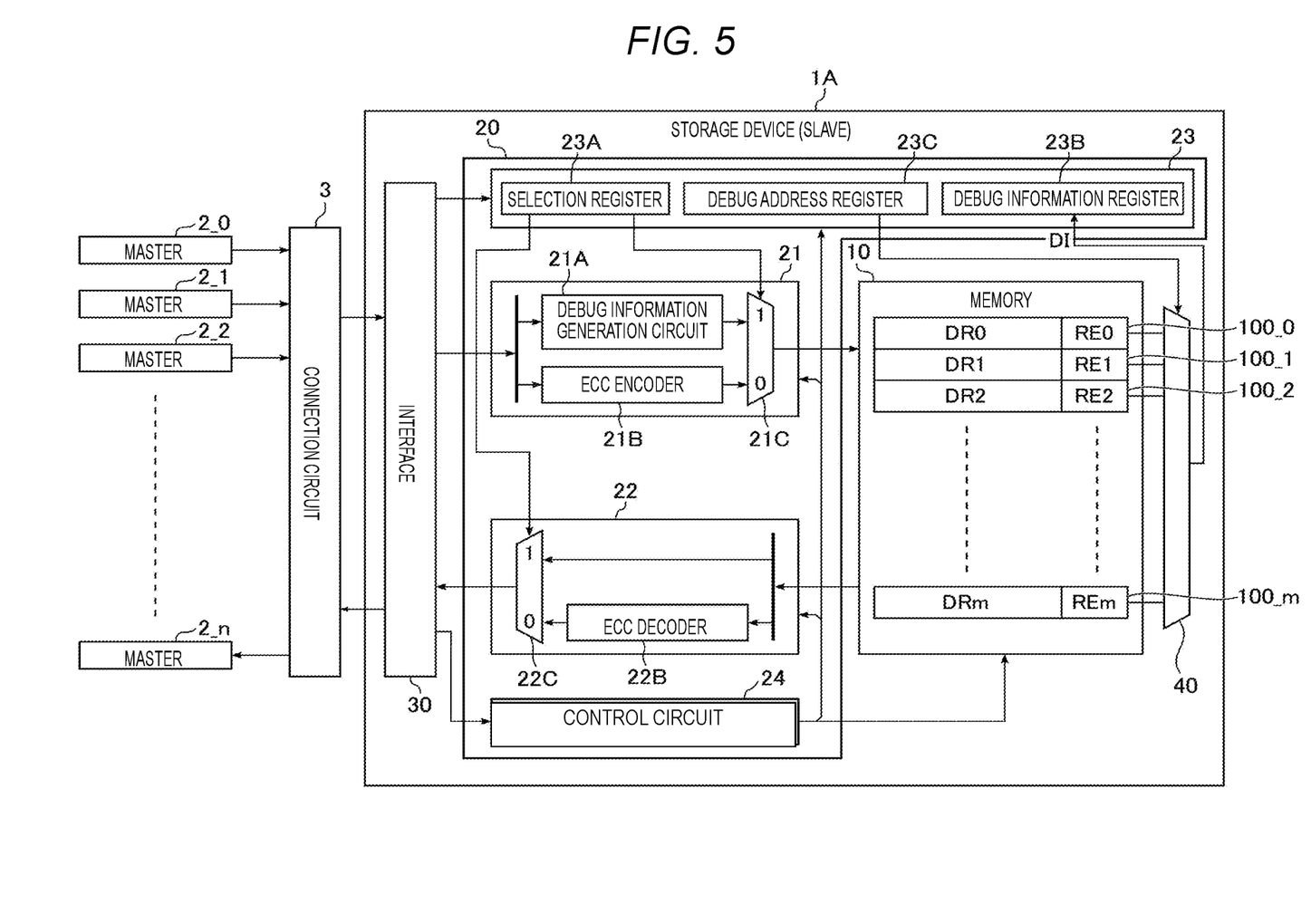
FIG. 5 is a block diagram illustrating a configuration of a storage device according to a second embodiment.

FIG. 5 is a block diagram illustrating a configuration of the storage device of the second embodiment. FIG. 5 also illustrates a configuration of an information processing system that includes the storage device. The information processing system includes a storage device (also referred as a slave) 1A, the plurality of masters 2, and the connection circuit 3.

The storage device 1A stores data received from at least one of the plurality of masters 2. Further, the storage device 1A transmits the stored data to at least one of the plurality of masters 2. The plurality of masters 2 are connected to the storage device 1A via the connection circuit 3.

Next, the internal configuration of the storage device 1A will be described. The storage device 1A includes the memory 10, the controller 20, the interface 30, and a selection circuit 40. The memory 10, the controller 20, and the interface 30 are the same as those of the storage device 1 of the first embodiment. The selection circuit 40 is a circuit that reads debug information DI from a redundant area REk. Specifically, the selection circuit 40 selects a redundant area REk from the plurality of redundant areas RE based on an address stored in a debug address register 23C to be described later. Further, the selection circuit 40 reads the debug information DI stored in the selected redundant area REk. The selection circuit 40 transmits the read debug information DI to the debug information register 23B. The debug information register 23B stores the received debug information DI. As in the first embodiment, the debug information DI may be stored in a region of the memory 10.

Next, the internal configuration of the controller 20 will be described. The controller 20 includes the write circuit 21, the read circuit 22, the register group 23, and the control circuit 24.

The write circuit 21 is a circuit that stores data in the memory 10. The write circuit 21 operates in either the debug operation mode or the normal operation mode. In the debug operation mode, the write circuit 21 adds debug information DI to write data that is input from the master 2, based on a write command from the master 2.

The read circuit 22 is a circuit that reads data from the memory 10. The read circuit 22 operates in either the debug operation mode or the normal operation mode. In the debug operation mode, the read circuit 22 reads data from, for example, the plurality of storage areas 100 based on a read command from the master 2. Further, the read circuit 22 outputs the read data to the master 2. In the normal operation mode, the read circuit 22 reads data and an error correction code from, for example, the plurality of storage areas 100 based on a read command from the master 2. Further, the read circuit 22 generates a syndrome based on the read data and the error correction code, and performs an error detection based on the generated syndrome. When no error is detected in the syndrome, the read circuit 22 outputs the read data to the master 2. When an error is detected in the syndrome, the read circuit 22 performs an error correction on the read data, and outputs the corrected data to the master 2.

The register group 23 is a circuit that stores a plurality of information on the operation mode and the debug information DI. The register group 23 includes the selection register 23A, the debug information register 23B, and the debug address register 23C. The selection register 23A stores selection information for selecting either the debug operation mode or the normal operation mode. The debug information register 23B stores debug information DI transmitted from the selection circuit 40. During the read operation in the debug operation mode, the debug address register 23C stores an address of a redundant area RE in the storage area 100 to be read.

The control circuit 24 is, for example, a state machine, a sequencer, or a central processing unit (CPU). The control circuit 24 controls the operations of the write circuit 21, the read circuit 22, the register group 23, and the memory 10.

Meanwhile, in the second embodiment, in the debug operation mode, the selection circuit 40 selects a redundant area REk from the plurality of redundant areas RE based on an address stored in the debug address register 23C. Further, the selection circuit 40 reads debug information DI from the selected redundant area REk. Thus, the read circuit 22 does not need to include the debug information acquisition circuit 22A provided in the read circuit 22 in the first embodiment.

2.2 Operation of Second Embodiment

Figure 6:
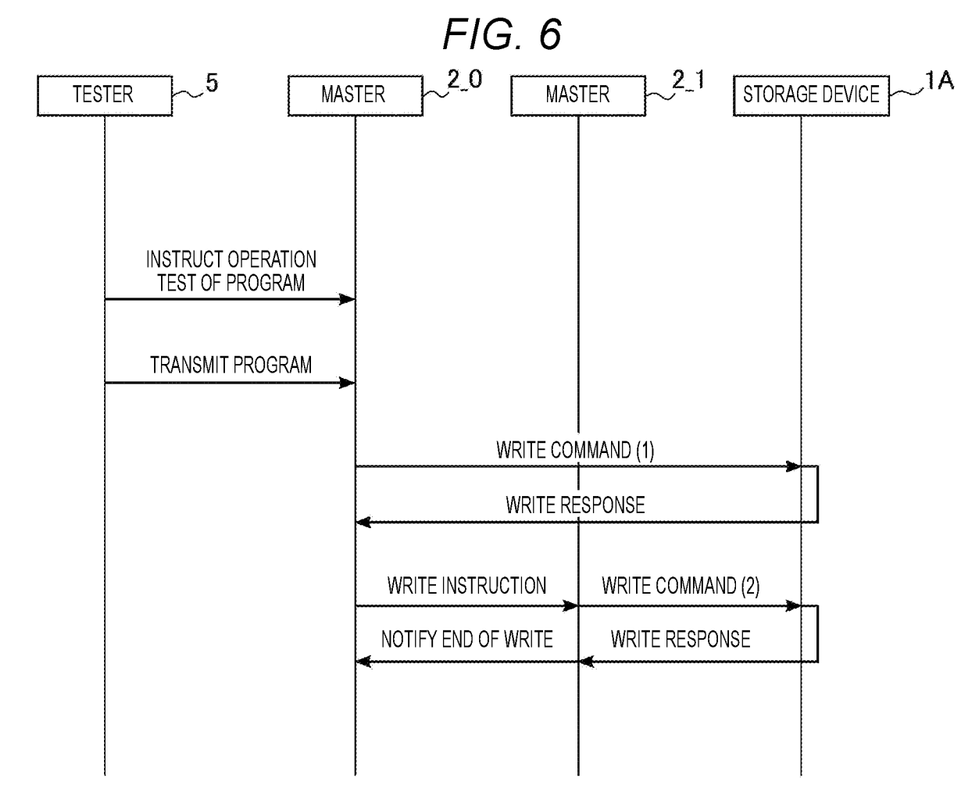
FIG. 6 illustrates an example of a program-based operation according to the second embodiment.

Hereinafter, the operation of the storage device 1A in the debug operation mode will be described in detail with reference to FIGS. 6, 7, and 8. FIG. 6 illustrates an example of a program-based operation in the information processing system that includes the storage device 1A according to the second embodiment. FIG. 6 represents an exchange of commands, operations, and an exchange of data among the tester 5, the masters 2_0 and 2_1, and the storage device 1A.

Hereinafter, a specific example of the operation test of a generated program will be described.

The tester 5 instructs the master 2_0 to perform an operation test of the program based on an instruction from the user 4. The tester 5 transmits the program to the master 2_0.

By executing the received program, the master 2_0 transmits a write command (1) to the storage device 1A. The write command (1) includes first data as write data, a first logical address, and master information MI1 indicating that the master 2_0 is a transmission source.

When the write command (1) is received, the storage device 1A converts the first logical address into a first physical address. Further, the debug information generation circuit 21A of the storage device 1A generates debug information DI1 based on the master information MI1. The debug information DI1 is, for example, information that includes the master information MI1.

The storage device 1A stores the first data in the data area of the storage area designated by the first physical address. Further, the storage device 1A stores the debug information DI1 in the redundant area of the storage area designated by the first physical address.

After the first data and the debug information DI1 are stored, the storage device 1A transmits a write response that notifies the end of the write operation, to the master 2_0.

After the write response is received, the master 2_0 transmits a write instruction to the master 2_1 by executing the program.

When the write instruction is received, the master 2_1 transmits a write command (2) to the storage device 1A. The write command (2) includes second data as write data, a second logical address, and master information MI2 indicating that the master 2_1 is a transmission source. The second logical address partially overlaps the first logical address due to the bug in the program.

When the write command (2) is received, the storage device 1A converts the second logical address into a second physical address. Further, the debug information generation circuit 21A of the storage device 1A generates debug information DI2 based on the master information MI2. The debug information DI2 is, for example, information that includes the master information MI2.

The storage device 1A stores the second data in the data area of the storage area designated by the second physical address. Further, the storage device 1A stores the debug information DI2 in the redundant area of the storage area designated by the second physical address. At least a portion of the first data written by the write operation according to the write command (1) is overwritten by the write operation according to the write command (2).

After the second data and the debug information DI2 are stored, the storage device 1A transmits a write response that notifies the end of the write operation, to the master 2_1.

When the write response is received, the master 2_1 transmits a signal that notifies the end of the write operation, to the master 2_0.

Descriptions have been made on the program-based operation in the specific example. The operation of the master 2_0 may differ according to a program executed by the master 2_0.

After the program-based operation in the specific example is ended, the master 2_0 inspects the data stored in the storage device 1A. FIG. 7 illustrates an example of an inspection operation according to the second embodiment.

After the signal that notifies the end of the write operation of the write command (2) is received, the master 2_0 transmits a read command (3) to the storage device 1A. The read command (3) includes the logical addresses included in the write commands of the previous program-based operation. That is, the read command (3) includes the first logical address included in the write command (1) and the second logical address included in the write command (2).

When the read command (3) is received, the storage device 1A converts the first logical address into the first physical address. Further, the storage device 1A converts the second logical address into the second physical address. The storage device 1A reads the first data and the second data from the respective data areas of the storage areas designated by the first physical address and the second physical address. Further, the storage device 1A reads the debug information DI1 and the debug information DI2 from the respective redundant areas of the storage areas designated by the first physical address and the second physical address.

The storage device 1A transmits the read first data, second data, debug information DI1, and debug information DI2 to the master 2_0.

Figure 7:
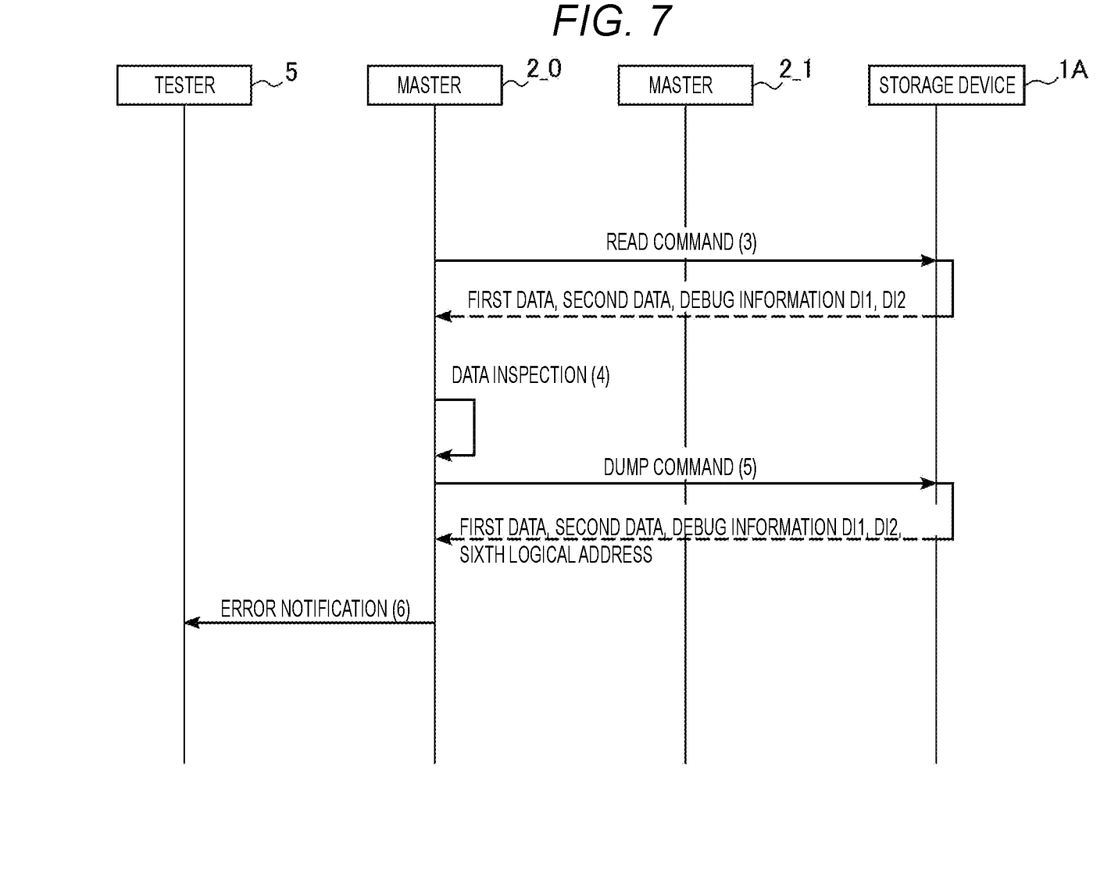
FIG. 7 illustrates an example of an inspection operation according to the second embodiment.

When the first data, the second data, the debug information DI1, and the debug information DI2 are received, the master 2_0 inspects the received first data, second data, debug information DI1, and debug information DI2 (depicted as data inspection (4) in FIG. 7). As a result of the inspection, the master 2_0 detects that an error of data destruction occurs in the first data.

The master 2_0 that has detected the occurrence of the error transmits a dump command (5) to the storage device 1A. The dump command (5) includes a logical address range including at least the first logical address, which is associated with the first data in which the occurrence of the error is detected during the data inspection (4), and the second logical address. When the dump command (5) is received, the storage device 1A converts the first logical address into the first physical address. The storage device 1A reads the first data from the data area of the storage area designated by the first physical address. The storage device 1A also reads the debug information DI1 from the redundant area of the storage area designated by the first physical address. Similarly, the storage device 1A converts the second logical address into the second physical address. The storage device 1A reads the second data from the data area of the storage area designated by the second physical address. The storage device 1A also reads the debug information DI2 from the redundant area of the storage area designated by the second physical address.

The storage device 1A generates a fourth physical address from the first physical address. The fourth physical address is an address that designates a redundant area of the storage area designated by the first physical address. The storage device 1A stores the fourth physical address in the debug address register 23C. Similarly, the storage device 1A generates a fifth physical address from the second physical address. The fifth physical address is an address that designates a redundant area of the storage area designated by the second physical address. The storage device 1A stores the fifth physical address in the debug address register 23C.

The storage device 1A converts a sixth physical address which is an address that designates the debug information register 23C, into a sixth logical address. The storage device 1A transmits the first data, second data, debug information DI1, and debug information DI2, and the sixth logical address to the master 2_0.

When the first data, the second data, the debug information DI1, the debug information DI2, and the sixth logical address are received, the master 2_0 notifies the tester 5 of the received first data, second data, debug information DI1, debug information DI2, and sixth logical address (depicted as error notification (6) in FIG. 7). Then, the operation test of the program by the tester 5 is ended.

When the error of data destruction is not detected in the first data during the data inspection (4), the master 2_0 notifies the tester 5 that no error is detected. After the notification, the operation test of the program by the tester 5 is ended.

Next, the read operation of debug information will be described. FIG. 8 illustrates the read operation of debug information according to the second embodiment. By the read operation of debug information, the user 4 may identify the transmission source of the write command (2) that causes the data destruction in the first data.

The tester 5 instructs the master 2_0 to read the debug information based on an instruction from the user 4.

When the instruction to read debug information is received, the master 2_0 transmits a read command (7) to the storage device 1A. The read command (7) includes the sixth logical address. The sixth logical address is an address that designates the debug address register 23C.

When the read command (7) is received, the storage device 1A converts the sixth logical address into the sixth physical address. The read circuit 22 outputs the fourth physical address and the fifth physical address to the selection circuit 40 from the debug address register 23C designated by the sixth physical address. The selection circuit 40 selects the redundant areas based on the fourth physical address and the fifth physical address. Further, the selection circuit 40 reads the debug information DI1 and the debug information DI2 from the selected redundant areas. The storage device 1A stores the debug information DI1 and the debug information DI2 read by the selection circuit 40 in the debug information register 23B or in the region of the memory 10. The storage device 1A also transmits the debug information DI1 and the debug information DI2 to the master 2_0.

Figure 8:
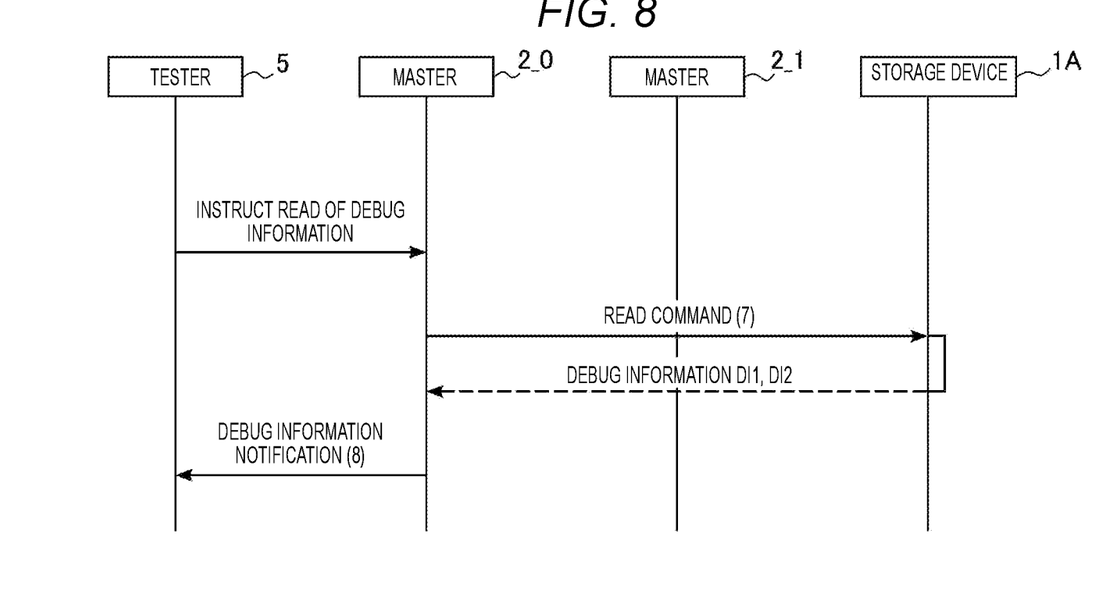
FIG. 8 illustrates a read operation of debug information according to the second embodiment.

When the debug information DI1 and the debug information DI2 are received, the master 2_0 notifies the tester 5 of the received debug information DI1 and debug information DI2 (depicted as debug information notification (8) in FIG. 8). Then, the read operation of debug information is ended.

2.3 Effects of Second Embodiment

According to the second embodiment, it is possible to provide a storage device capable of acquiring debug information when software is developed. That is, according to the storage device 1A of the second embodiment, debug information can be acquired when software is developed.

As a result, according to the storage device 1A of the second embodiment, when a data destruction occurs, the transmission source of the write command that causes the data destruction can be specified by reading debug information. Further, the storage device 1A includes the debug address register 23C that stores an address of a redundant area, and the selection circuit 40 that reads debug information DI from a redundant area based on the address of the redundant area. As a result, the debug information DI can be easily acquired.

Further, according to the storage device 1A of the second embodiment, a memory management unit (MMU) does not need to be provided to prevent the data destruction, so that an increase in product costs can be suppressed.

3. Modification

In the storage device 1A of the first embodiment or the second embodiment, the memory 10 includes an SRAM. However, the memory 10 may include a semiconductor storage device other than the SRAM.

4. Comparative Example

Figure 9:
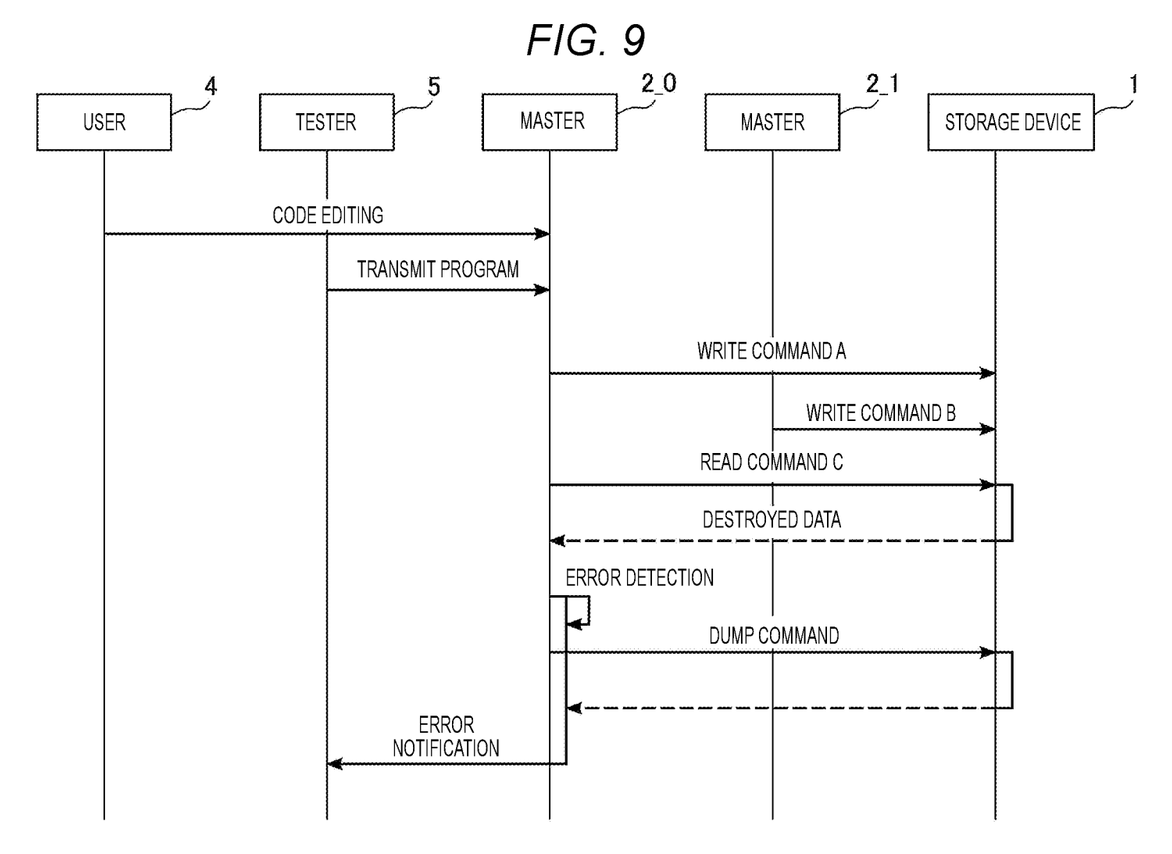
FIG. 9 illustrates operations carried out in a comparative example that causes data destruction.

Hereinafter, a comparative example to the embodiments of the present invention and a problem in the comparative example will be described with reference to FIG. 9.

For example, in a case where data are written from a plurality of masters to a storage device when firmware or programs are developed, storage areas in which the data are written may overlap with each other. In this case, data written earlier may be overwritten by data written later. That is, data destruction occurs in which data written according to a previous write command A is overwritten by a write operation according to a later write command B. When the data destruction occurs, destroyed data is read by a read command C. Further, a process is performed using the destroyed data. As a result, it is detected that the data destruction is occurring.

When the data destruction is detected, by dumping data from the storage areas, it is confirmed that the data destruction is occurring in the data stored in the storage area. Next, a master that destructs the data is inspected, that is, a master that transmits the write command which overwrote the data in the storage area is inspected. However, it is difficult to identify the master that causes the data destruction if no information to identify the master is included in the dumped data.

While certain embodiments have been described, these embodiments have been presented by way of example only, and are not intended to limit the scope of the disclosure.

Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:
a memory that includes a data area and a redundant area that corresponds to the data area;
a write circuit configured to write first data specified in a write command to the data area, and write first information about a transmission source which has transmitted the write command, to the redundant area;
a read circuit configured to read the first data as second data from the data area, and read the first information as second information from the redundant area, in response to a read command; and
a first storage circuit configured to store the second information read by the read circuit.

2. The storage device according to claim 1, wherein the read circuit is configured to return the second data and the second information to a read destination which has transmitted the read command.

3. The storage device according to claim 2, wherein the read destination of the read command is a first central processing unit (CPU) and the transmission source of the write command is a second CPU, and the second information includes information indicating the second CPU.

4. The storage device according to claim 3, wherein the second information is provided to the first CPU and the first CPU is configured to detect whether or not data written by the first CPU to the data area has been overwritten by the second CPU.

5. The storage device according to claim 1, wherein
in response to another read command that specifies a logical address that maps to a physical address of the first storage circuit, the read circuit returns the second information stored in the first storage circuit to a read destination which has transmitted said another read command.

6. The storage device according to claim 1, wherein
the write circuit is in a first mode of operation when the write circuit writes the first data to the data area and writes the first information to the redundant area,
the read circuit is in the first mode of operation when the read circuit reads the first data as the second data from the data area and reads the first information as the second information from the redundant area and the first storage circuit stores the second information read by the read circuit, and
the write circuit, when operating in a second mode of operation, writes the first data to the data area and writes a first error correction code for the first data to the redundant area, and
the read circuit, when operating in the second mode of operation, reads the first data as the second data from the data area, reads the first error correction code as a second error correction code from the redundant area, and performs an error detection on the second data based on the second data and the second error correction code.

7. The storage device according to claim 6, further comprising:

a second storage circuit configured to store selection information for selecting either the first mode of operation or the second mode of operation,
wherein based on the selection information stored in the second storage circuit, the write circuit and the read circuit operate in either the first mode of operation or the second mode of operation.

8. The storage device according to claim 6, wherein
the write circuit includes a generation circuit and an encoder, and the read circuit includes an acquisition circuit and a decoder,
during the first mode of operation, the generation circuit generates the first information, and the acquisition circuit acquires the second information and outputs the second information to the first storage circuit, and
during the second mode of operation, the encoder generates the first error correction code, and the decoder performs an error detection in the second data, based on the second data and the second error correction code.

9. The storage device according to claim 6, further comprising:
a second storage circuit configured to store selection information for selecting either the first mode of operation or the second mode of operation, wherein
the write circuit includes a generation circuit, an encoder, and a first selection circuit, and the generation circuit generates the first information, and the encoder generates the first error correction code,
the read circuit includes an acquisition circuit, a decoder, and a second selection circuit, and the acquisition circuit acquires the second information and outputs the second information to the first storage circuit, and the decoder performs an error detection on the second data based on the second data and the second error correction code, and
based on the selection information stored in the second storage circuit, the first selection circuit and the second selection circuit perform either a first selection that selects the generation circuit and the acquisition circuit, respectively, or a second selection that selects the encoder and the decoder, respectively.

10. A storage device comprising:
a memory that includes a data area and a redundant area that corresponds to the data area;
a write circuit configured to write first data specified in a write command to the data area, and write first information about a transmission source which has transmitted the write command, to the redundant area;
a read circuit configured to read the first data as second data from the data area in response to a read command;
a first storage circuit configured to store an address of the redundant area;
a selection circuit configured to select the redundant area based on the address stored in the first storage circuit, and output the first information as second information stored in the redundant area; and
a second storage circuit configured to store the second information output by the selection circuit.

11. The storage device according to claim 10, wherein the read circuit is configured to return the second data and the second information to a read destination which has transmitted the read command.

12. The storage device according to claim 11, wherein the read destination of the read command is a first central processing unit (CPU) and the transmission source of the write command is a second CPU, and the second information includes information indicating the second CPU.

13. The storage device according to claim 12, wherein the second information is provided to the first CPU and the first CPU is configured to detect whether or not data written by the first CPU to the data area has been overwritten by the second CPU.

14. The storage device according to claim 10, wherein
in response to another read command that specifies a logical address that maps to a physical address of the second storage circuit, the read circuit returns the second information stored in the second storage circuit to a read destination which has transmitted said another read command.

15. A method of operating a storage device in a normal mode of operation and a debug mode of operation, wherein the storage device includes a memory that includes a data area and a redundant area that corresponds to the data area, said method comprising:
while operating in the debug mode of operation, writing first data specified in a write command to the data area, and first information about a transmission source which has transmitted the write command, to the redundant area; and
while operating in the debug mode of operation, reading the first data as second data from the data area, and the first information as second information from the redundant area, in response to a read command, and storing the second information read in a first storage circuit of the storage device.

16. The method according to claim 15, further comprising:
while operating in the debug mode of operation, after the reading, returning the second data and the second information to a read destination which has transmitted the read command.

17. The method according to claim 16, wherein the read destination of the read command is a first central processing unit (CPU) and the transmission source of the write command is a second CPU, and the second information includes information indicating the second CPU.

18. The method according to claim 17, wherein the second information is provided to the first CPU and the first CPU detects whether or not data written by the first CPU to the data area has been overwritten by the second CPU.

19. The method according to claim 15, further comprising:
while operating in the debug mode of operation, in response to another read command that specifies a logical address that maps to a physical address of the first storage circuit, returning the second information stored in the first storage circuit to a read destination which has transmitted said another read command.

20. The method according to claim 15, further comprising:
while operating in the normal mode of operation, in response to the write command, writing the first data to the data area, and a first error correction code for the first data to the redundant area; and
while operating in the normal mode of operation, in response to the read command, reading the first data as the second data from the data area and the first error correction code as a second error correction code from the redundant area, and performing an error detection on the second data based on the second data and the second error correction code.

* * * * *